(12) United States Patent
Yamamoto et al.

(10) Patent No.: US 6,737,923 B2
(45) Date of Patent: May 18, 2004

(54) HIGH FREQUENCY CIRCUIT

(75) Inventors: Shinji Yamamoto, Osaka (JP);
Katsushi Tara, Kyoto (JP); Tsunehiro Takagi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/377,509

(22) Filed: Feb. 28, 2003

(65) Prior Publication Data

US 2003/0164737 A1 Sep. 4, 2003

(30) Foreign Application Priority Data

Mar. 4, 2002 (JP) ........................................ 2002-057511

(51) Int. Cl.[7] ................................................. H03F 3/04
(52) U.S. Cl. ........................................ 330/302; 330/310
(58) Field of Search ................................. 330/302, 310, 330/311, 285, 98

(56) References Cited

U.S. PATENT DOCUMENTS 6,538,515 B2 * 3/2003 Brandt ........................ 330/285
6,603,351 B2 * 8/2003 Suzuki ........................ 330/133
6,630,861 B2 * 10/2003 Kawaoka ..................... 330/133

* cited by examiner

*Primary Examiner*—Henry Choe
(74) *Attorney, Agent, or Firm*—Merchant & Gould P.C.

(57) ABSTRACT

A high-frequency circuit is provided that can prevent the generation of an undesired peak and contribute to the reduction in area of a chip. The high-frequency circuit includes an amplifying block 10 in which an amplifying element 11, a choke inductor 12, and a by-pass capacitor 13 are provided, and an amplifying block 20 in which an amplifying element 21, a choke inductor 22, and a by-pass capacitor 23 are provided. Electric power is supplied from a common power terminal 31 to the amplifying element 21 via the choke inductor 22 and to the amplifying element 11 via the choke inductor 12 and a resistive element 37. The amplifying elements 11 and 21, the choke inductors 12 and 22, the by-pass capacitors 13 and 23, and the resistive element 37 are formed on the same substrate.

4 Claims, 6 Drawing Sheets

HIGH FREQUENCY CIRCUIT

BACKGROUND OF THE INVENTION

1. Field of the Invention

The present invention relates to a high-frequency circuit including an amplifying element. In particular, the present invention relates to a high-frequency circuit including amplifying blocks arranged in multi-stages.

2. Description of the Related Art

Hereinafter, a conventional high-frequency circuit will be described with reference to FIG. 7. FIG. 7 is a circuit diagram showing one example of a conventional high-frequency circuit. FIG. 7 gives an example of the high-frequency circuit in which amplifying blocks are arranged in two stages.

As shown in FIG. 7, a first-stage amplifying block includes an amplifying element 101, a choke inductor 111, and a by-pass capacitor 121. Similarly, a second-stage amplifying block includes an amplifying element 102, a choke inductor 112, and a by-pass capacitor 122.

In the first-stage amplifying block, a power terminal of the amplifying element 101 is connected to one end of the choke inductor 111, the other end of the choke inductor 111 is connected to one end of the by-pass capacitor 121, and the other end of the by-pass capacitor 121 is grounded. Similarly, in the second-stage amplifying block, a power terminal of the amplifying element 102 is connected to one end of the choke inductor 112, the other end of the choke inductor 112 is connected to one end of the by-pass capacitor 122, and the other end of the by-pass capacitor 122 is grounded.

The choke inductors 111 and 112 achieve low impedance with respect to a direct-current component from a common power terminal 143, thereby forming power supply lines to the amplifying elements 101 and 102, respectively. On the other hand, with respect to an alternating-current component from an input terminal 141, the choke inductors 111 and 112 achieve high impedance (an open-circuit state). The by-pass capacitors 121 and 122 ground a high-frequency component (an alternating-current component) from the power supply voltage side of the choke inductors 111 and 112, respectively.

In this high-frequency circuit, a signal input from the input terminal 141 is input to the amplifying element 101 via a matching circuit 131, and is output from the amplifying element 101 after being amplified. The signal output from the amplifying element 101 is then input to the amplifying element 102 via a matching circuit 132, and is output from the amplifying element 102 after being further amplified. The signal output from the amplifying element 102 is then output to the outside of the circuit via a matching circuit 133 and an output terminal 142.

By the way, for efficient signal transmission in a high-frequency circuit, impedance matching is important. The impedance matching is to bring about a condition in which the impedances of two amplifying blocks connected with each other are equal in magnitude but opposite in phase in Smith chart (such a condition is referred to as a "conjugate match"). For example, when an amplifying block A and an amplifying block B are connected with each other, the impedance matching is to adjust the impedance of the amplifying block A to [R+jX (Ω)] and the impedance of the amplifying block B to [R−jX (Ω)]. In this case, reflection of signals can be avoided, thus allowing 100% of signals to be transmitted.

In general, in the high-frequency circuit as shown in FIG. 7, the impedance of the signal line is designed to be 50 Ω, and the impedance of the input and output also is designed to be 50 Ω. However, in many cases, the impedance of the amplifying elements is different from 50 Ω. On this account, the matching circuits 131, 132, and 133 are arranged to achieve impedance matching by creating a conjugate match between the impedances of the amplifying blocks, thus allowing efficient signal transmission.

In the high-frequency circuit with the two-stage amplifying blocks shown in FIG. 7, to decrease the number of power terminals, electric power is supplied from the common power terminal 143 to the amplifying elements in the respective amplifying blocks via the choke inductor 111 or 112. This brings about a condition in which the first-stage amplifying block and the second-stage amplifying block are coupled with each other directly. In this case, unless both the by-pass capacitors 121 and 122 have an infinite capacitance, an undesired peak is generated so that a desired frequency characteristic cannot be obtained.

FIG. 8 is a graph showing the result of a simulation performed to examine a frequency characteristic of the conventional high-frequency circuit shown in FIG. 7. In FIG. 8, the horizontal axis indicates a frequency (GHz) from 0.1 (GHz) to 10.1 (GHz) graduated in 1 (GHz) increments. On the other hand, the vertical axis indicates a forward gain [Gain] (dB) from −50 (dB) to 50 (dB) graduated in 10 (dB) increments. In FIG. 8, the mark "M1" indicates a forward gain at a design frequency of 5.84 (GHz), and I1 indicates a frequency (GHz) at a point where the measurement is carried out.

As can be seen from FIG. 8, in the high-frequency circuit shown in FIG. 7, a forward gain of about 18.6 (dB) is obtained at the design frequency of 5.84 (GHz). However, as indicated by the mark "M2", after a forward gain of about −1.0 (dB) is obtained at a frequency of 2.28 (GHz), the forward gain drops, thereby generating an undesired peak.

The cause of the undesired peak is considered to be as follows. As described above, because the by-pass capacitors 121 and 122 in the respective amplifying blocks have a limited capacitance, sufficient high-frequency grounding is not attained at the frequency at which the undesired peak is generated. More specifically, because the grounding of the high-frequency component from the choke inductors 111 and 112 is not perfect, feedback of high frequency signals is caused between the first-stage amplifying block and the second-stage amplifying block, thereby causing the undesired peak to be generated.

However, the capacitance of the by-pass capacitors 121 and 122 is limited to a certain value as long as the area of the chip is limited. Thus, obtaining an infinite capacitance is almost impossible. On this account, in a high-frequency circuit shown in FIG. 9, a high-frequency separation element 151 is arranged between a first-stage amplifying block and a second-stage amplifying block to prevent the feedback of the high frequency signals from being caused between the first-stage amplifying block and the second-stage amplifying block.

FIG. 9 is a circuit diagram showing another example of a conventional high-frequency circuit. In the high-frequency circuit shown in FIG. 9, the high-frequency separation element 151 is arranged between the first-stage amplifying block and the second-stage amplifying block to prevent an undesired peak. As the high-frequency separation element 151, a λ/4 line or an inductor generally is used.

In this high-frequency circuit, electric power is supplied to a power terminal of an amplifying element 101 via a common power terminal 143, the high-frequency separation element 151, and a choke inductor 111. On the other hand, electric power is supplied to a power terminal of an amplifying element 102 via a choke inductor 112.

However, the λ/4 line and the inductor are elements taking up a large area on a chip. Therefore, such elements inhibit the reduction in area of the chip, thereby causing a problem in that the reduction in size of a chip provided with a high-frequency circuit cannot be achieved.

SUMMARY OF THE INVENTION

It is an object of the present invention to solve the above-described problem and to provide a high-frequency circuit that can prevent the generation of an undesired peak and contribute to the reduction in area of a chip.

To achieve the above-described object, a high-frequency circuit according to the present invention includes a plurality of amplifying blocks arranged in multi-stages, including at least a first-stage amplifying block and a final-stage amplifying block. Each of the plurality of amplifying blocks includes at least an amplifying element, a choke inductor, and a by-pass capacitor, in which a power terminal of the amplifying element is connected to one end of the choke inductor, the other end of the choke inductor is connected to one end of the by-pass capacitor, and the other end of the by-pass capacitor is grounded. Electric power is supplied from a common power terminal to the amplifying elements in the respective amplifying blocks via the choke inductors in the respective amplifying blocks. A resistive element is provided between the common power terminal and the choke inductor in the amplifying block other than the final-stage amplifying block so that the electric power is supplied to the amplifying element in the amplifying block other than the final-stage amplifying block via the resistive element and the choke inductor, and at least the amplifying elements, the choke inductors, the by-pass capacitors, and the resistive element are provided on a same substrate.

In the high-frequency circuit according to the present invention, a field-effect transistor or a bipolar transistor can be used as the amplifying element. Further, in the high-frequency circuit according to the present invention, it is preferable that a voltage applied to the common power terminal and a resistance of the resistive element are set so that a voltage applied to the amplifying element in the first-stage amplifying block is greater than a knee voltage of the amplifying element in the first-stage amplifying block.

These and other advantages of the present invention will become apparent to those skilled in the art upon reading and understanding the following detailed description with reference to the accompanying figures.

DETAILED DESCRIPTION OF THE INVENTION (Embodiment 1)

Figure 1:
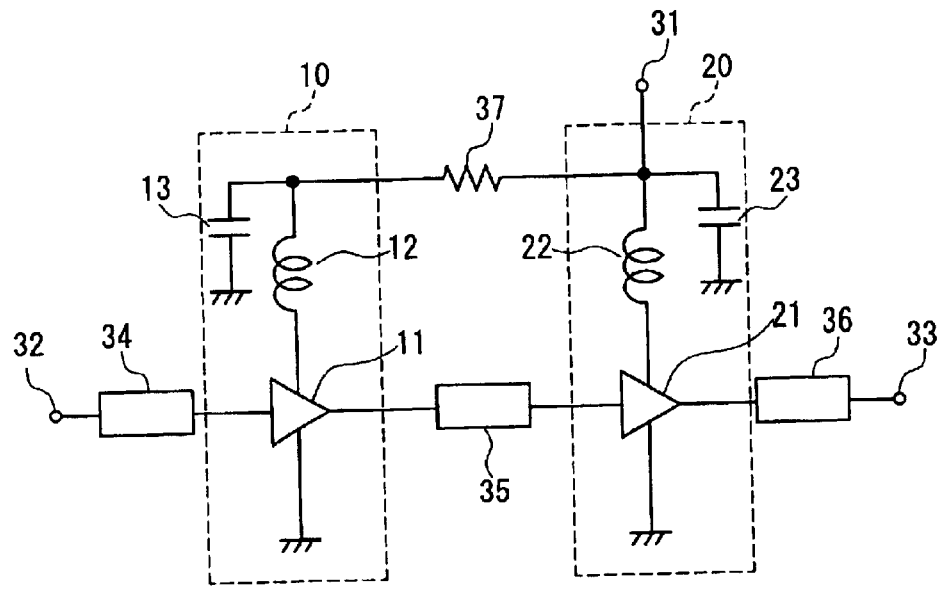
FIG. 1 is a circuit diagram showing one example of a high-frequency circuit according to Embodiment 1 of the present invention.

Hereinafter, a high-frequency circuit according to Embodiment 1 of the present invention will be described with reference to FIGS. 1 to 5. FIG. 1 is a circuit diagram showing one example of a high-frequency circuit according to Embodiment 1 of the present invention.

Figure 7:
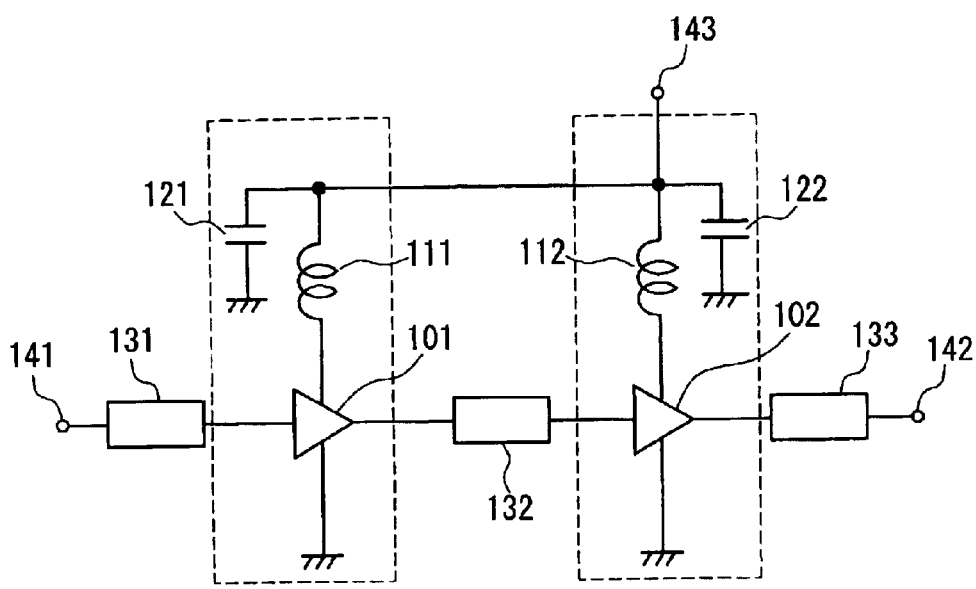
FIG. 7 is a circuit diagram showing one example of a conventional high-frequency circuit.
Figure 9:
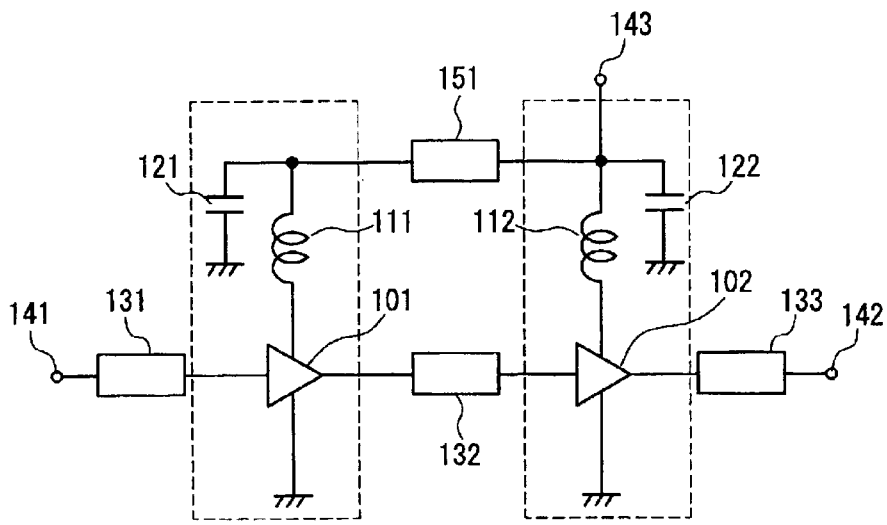
FIG. 9 is a circuit diagram showing another example of a conventional high-frequency circuit.

As shown in FIG. 1, in the high-frequency circuit according to Embodiment 1, amplifying blocks 10 and 20 are arranged in two stages, as in the conventional examples shown in FIGS. 7 and 9. Also in the high-frequency circuit of Embodiment 1, an amplifying block 10 includes an amplifying element 11, a choke inductor 12, and a by-pass capacitor 13. Similarly, an amplifying block 20 includes an amplifying element 21, a choke inductor 22, and a by-pass capacitor 23.

In the amplifying block 10, a power terminal of the amplifying element 11 is connected to one end of the choke inductor 12, the other end of the choke inductor 12 is connected to one end of the by-pass capacitor 13, and the other end of the by-pass capacitor 13 is grounded. Similarly, in the amplifying block 20, a power terminal of the amplifying element 21 is connected to one end of the choke inductor 22, the other end of the choke inductor 22 is connected to one end of the by-pass capacitor 23, and the other end of the by-pass capacitor 23 is grounded.

Further, as in the conventional examples shown in FIGS. 7 and 9, in the high-frequency circuit according to Embodiment 1, a signal input from the input terminal 32 is input to the amplifying element 11 via a matching circuit 34, and is output from the amplifying element 11 after being amplified. The signal output from the amplifying element 11 is then input to the amplifying element 21 via a matching circuit 35, and is output from the amplifying element 21 after being further amplified. The signal output from the amplifying element 21 is then output to the outside of the circuit via a matching circuit 36 and an output terminal 33.

Further, also in Embodiment 1, electric power is supplied from a common power terminal 31 to the amplifying elements in the respective amplifying blocks via the choke inductor 12 or 22, which brings about a condition in which the first-stage amplifying block 10 and the second-stage amplifying block 20 are coupled with each other directly.

However, unlike the conventional examples shown in FIGS. 7 and 9, the high-frequency circuit according to Embodiment 1 includes a resistive element 37 provided between the amplifying blocks 10 and 20. That is, the high-frequency circuit of Embodiment 1 is different from the conventional examples in that electric power is supplied to the amplifying element 11 in the amplifying block 10 closer to the input terminal 32 via the resistive element 37 provided between the common power terminal 31 and the choke inductor 12 in the amplifying block 10.

Figure 8:
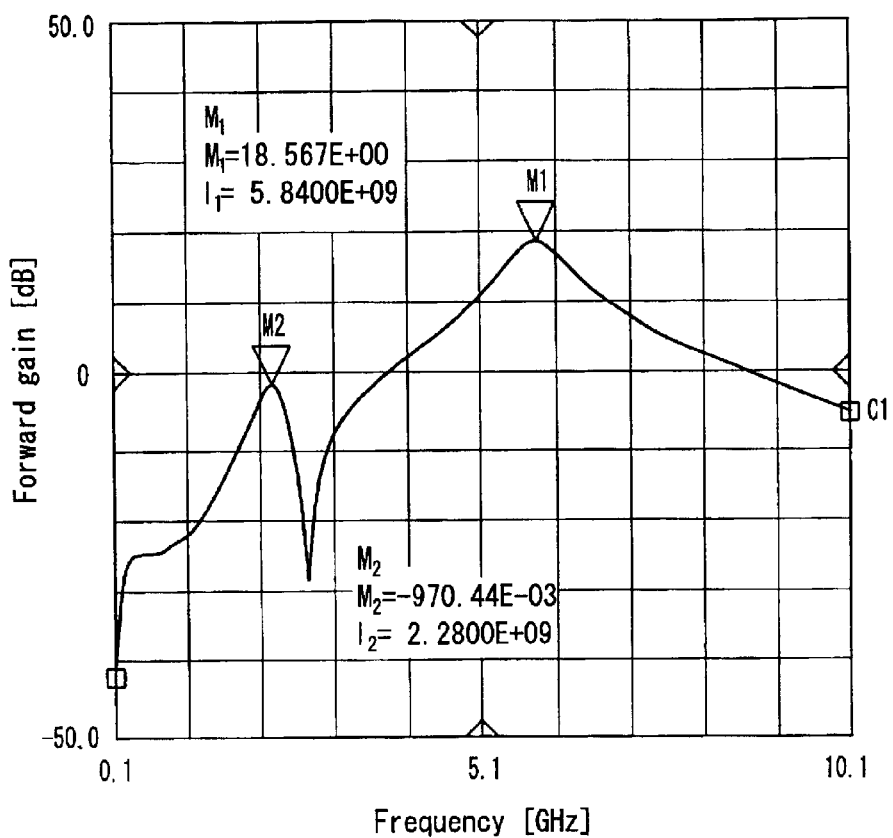
FIG. 8 is a graph showing the result of a simulation performed to examine a frequency characteristic of the conventional high-frequency circuit shown in FIG. 7.

With the above-described configuration, the feedback of high frequency signals caused between the amplifying blocks 10 and 20 can be reduced without making the capacitance of the by-pass capacitors 13 and 23 in the respective amplifying blocks infinite. As a result, the generation of an undesired peak as shown in FIG. 8 can be reduced.

Further, in the high-frequency circuit according to Embodiment 1, the amplifying elements 11 and 12, the choke inductors 12 and 22, the by-pass capacitors 13 and 23, the resistive element 37, and the matching circuits 34 to 36 are formed on the same semiconductor substrate, and are integrated in one chip.

In order to reduce the size of the chip, it is necessary to reduce the area occupied by each element on the chip (substrate). The resistive element used in Embodiment 1 occupies a smaller area on the chip than the high-frequency separation element shown in FIG. 9. Therefore, by using a high-frequency circuit according to Embodiment 1, it becomes possible to promote the reduction in size of the chip.

Besides, in the high-frequency circuit according to Embodiment 1, because no resistive element is provided between the choke inductor 22 in the second-stage (final-stage) amplifying block 20 and the common power terminal 31, the voltage applied to the amplifying block 20 is higher than the voltage applied to the amplifying block 10. Thus, electric energy handled in the amplifying block 20 can be made greater than that in the amplifying block 10.

In the present invention, a field-effect transistor (hereinafter, referred to as "FET"), a bipolar transistor, or the like can be used as an amplifying element.

Figure 2:
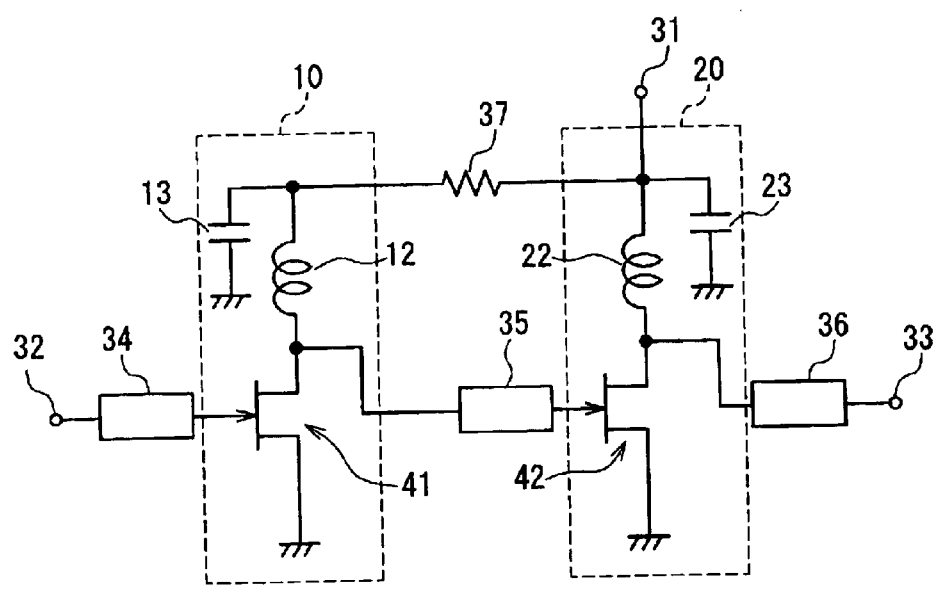
FIG. 2 is a circuit diagram showing the high-frequency circuit according to Embodiment 1 in which a field-effect transistor is used as an amplifying element.

FIG. 2 is a circuit diagram showing the high-frequency circuit according to Embodiment 1 in which a FET is used as an amplifying element. The high-frequency circuit shown in FIG. 2 has the same configuration as that of the high-frequency circuit shown in FIG. 1 except that FETs 41 and 42 are used as the amplifying elements in the respective amplifying blocks. Therefore, the high-frequency circuit shown in FIG. 2 can perform the same function and produces the same effect as those described above with regard to the high-frequency circuit shown in FIG. 1.

Figure 3:
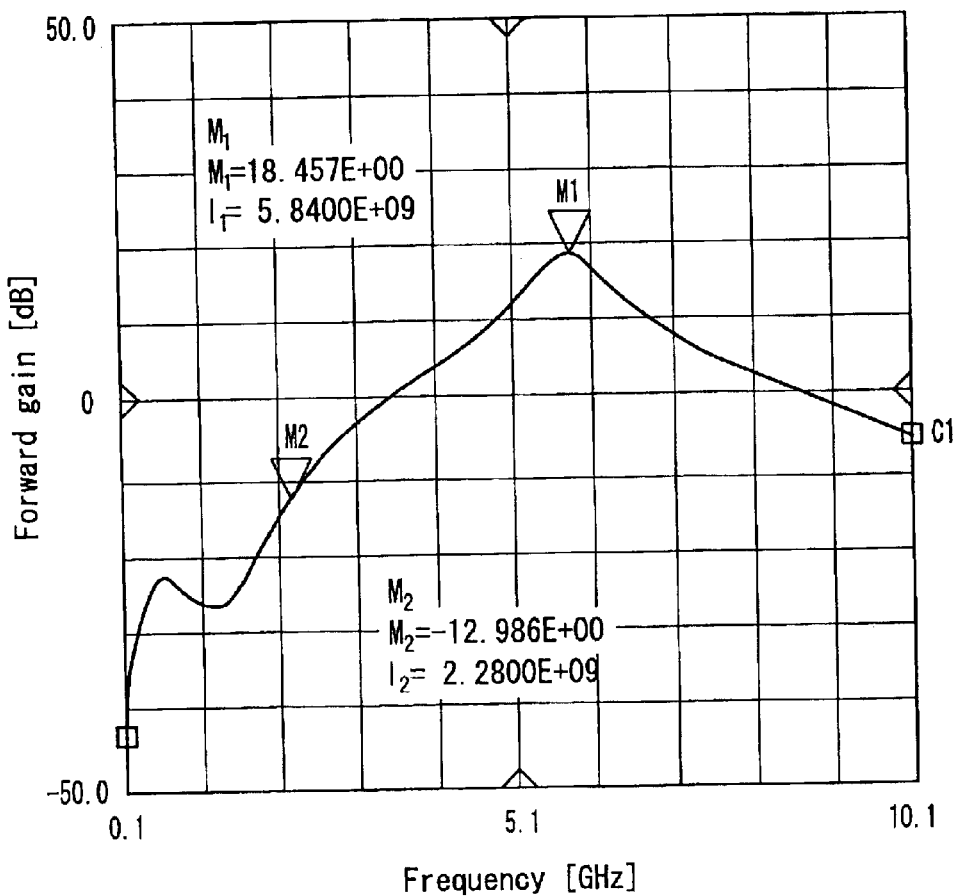
FIG. 3 is a graph showing the result of a simulation performed to examine a frequency characteristic of the high-frequency circuit shown in FIG. 2.

FIG. 3 is a graph showing the result of a simulation performed to examine a frequency characteristic of the high-frequency circuit shown in FIG. 2. In FIG. 3, the horizontal axis indicates a frequency (GHz) from 0.1 (GHz) to 10.1 (GHz) graduated in 1 (GHz) increments. On the other hand, the vertical axis indicates a forward gain [Gain] (dB) from −50 (dB) to 50 (dB) graduated in 10 (dB) increments. In FIG. 3, the mark "M1" indicates a forward gain at a design frequency of 5.84 (GHz).

As can be seen from FIG. 3, in the high-frequency circuit shown in FIG. 2, a forward gain of about 18.5 (dB) is obtained at the design frequency of 5.84 (GHz), as in the graph of FIG. 8. Therefore, it can be said that the resistive element 37 causes substantially no decrease in forward gain.

Further, in the example of FIG. 8, an undesired peak is generated at a frequency of 2.28 (GHz). In contrast, in the example of FIG. 3, the forward gain at a frequency of 2.28 (GHz) is about −13 (dB) and it does not drop thereafter, so that no undesired peak is generated.

Figure 4:
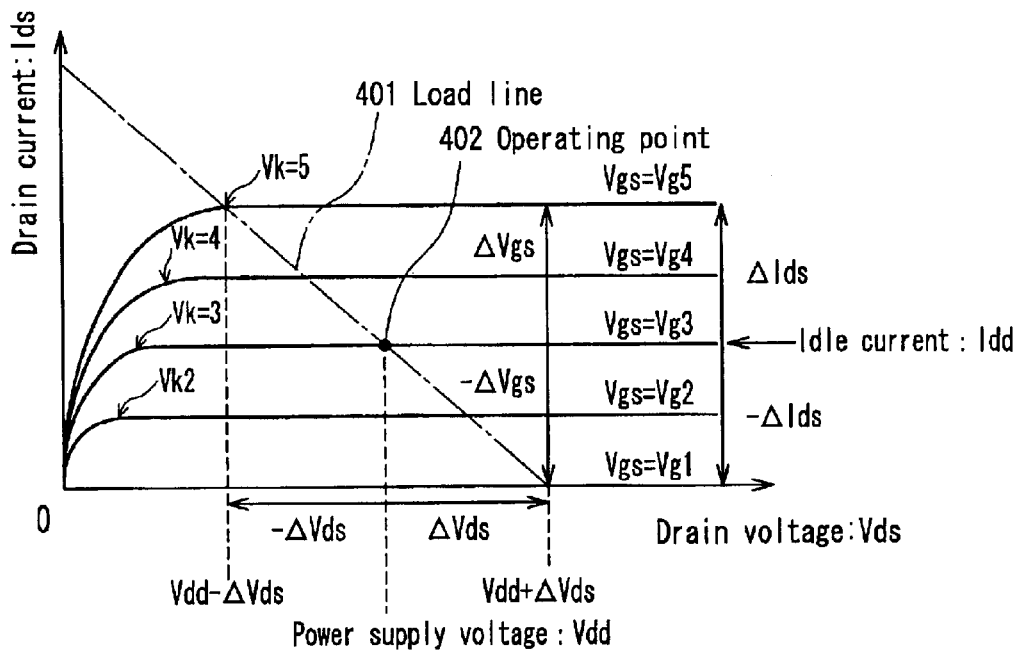
FIG. 4 is a graph showing an operating point when a field-effect transistor is used as an amplifying element.

Hereinafter, an operating point when a FET is used as an amplifying element will be described. FIG. 4 is a graph showing an operating point when a FET is used as an amplifying element. In FIG. 4, the horizontal axis indicates a drain-to-source voltage (Vds) of the FET, and the vertical axis indicates a drain current (Ids) of the FET.

FIG. 4 shows Vds-Ids curves obtained by varying the drain-to-source voltage (Vds) of the FET as a parameter in the range from Vg1 to Vg5. In FIG. 4, numeral 401 denotes a load line, and numeral 402 denotes an operating point.

As can be seen from FIG. 4, the respective Vds-Ids curves obtained by varying Vgs are quadratic curves in which Ids increases in proportion to an increase in Vds until Vds reaches a certain value. However, after Vds exceeds the certain value, the Vds-Ids curves are straight lines parallel to the horizontal axis in which Ids remains constant. Vds at the point where the quadratic curves turn into the straight lines is called a "knee voltage". In FIG. 4, the knee voltages of the respective Vds-Ids curves are represented by Vk2 to Vk5. It is to be noted here that, when Vgs=Vg1, Vk is not defined because Ids is always 0.

In the case where this FET is used as a common-source amplifying element, i.e., as the amplifying element of the high-frequency circuit shown in FIG. 2, the operating point (DC bias point) 402 is determined by setting an idle current (Idd) and a power supply voltage (Vdd). Further, the FET is designed so that the load line 401 would be a straight line passing through the point representing the knee voltage Vk5 on the Vds-Ids curve where Vds=Vg5 and the operating point 402.

In the FET thus designed, an amplifying operation is carried out in such a manner that the intersection (point) of Vds and Ids moves on the load line 401. That is, when Vgs serving as an input voltage is varied within a range of ±ΔVgs from Vg3 as a reference value, Ids varies within a range of ±ΔIds from the idle current (Idd) as a reference value, and Vds varies within a range of ±ΔVds from the power supply voltage (Vdd) as a reference value.

Thus, in order to operate the FET as the amplifying element of the high-frequency circuit as shown in FIG. 2, it is necessary to set a power supply voltage to be equal to or higher than Vk5. Further, although the knee voltage varies slightly depending on the value of Vgs as described above, the knee voltage generally is set to be about 0.5 V in a small signal FET and to be about 0.5 V or higher in a power FET, for example.

The following is a description of how the power supply voltage (Vdd) and the resistance of the resistive element are set when the FET is used as the amplifying element of the high-frequency circuit as shown in FIG. 2. The voltage drop in the resistive element 37 can be determined by [R×Idd] where R is a resistance of the resistive element 37 and Idd is an idle current. On the other hand, the power supply voltage (Vdd) applied to the FET 41 is determined by [V−R×Idd] where V is a voltage applied to the common power terminal 31 (i.e., a voltage applied to the entire integrated circuit).

Accordingly, in order to operate the FET 41 stably, the voltage V applied to the common power terminal 31 and the resistance R of the resistive element 37 need to be set so as to satisfy the relationship [V−R×Idd]>Vk. For example, when the FET 41 is a small signal FET, the knee voltage Vk generally is about 0.5 V. Thus, the voltage V applied to the common power terminal 31 and the resistance R of the resistive element 37 may be set so as to satisfy the relationship [V−R×Idd]>about 0.5 V. However, it is preferable to set the voltage V and the resistance R as to satisfy the relationship [V−R×Idd]>(1.0 V to 1.5 V or higher) because consideration needs to be given to the amplitude of ΔVds in practice.

Further, the power supply voltage (Vdd) applied to FET 42 is V. Thus, the power supply voltage of the FET 42 is higher than that of the FET 41. Besides, electric energy handled in the FET 42 is greater than that in the FET 41.

Figure 5:
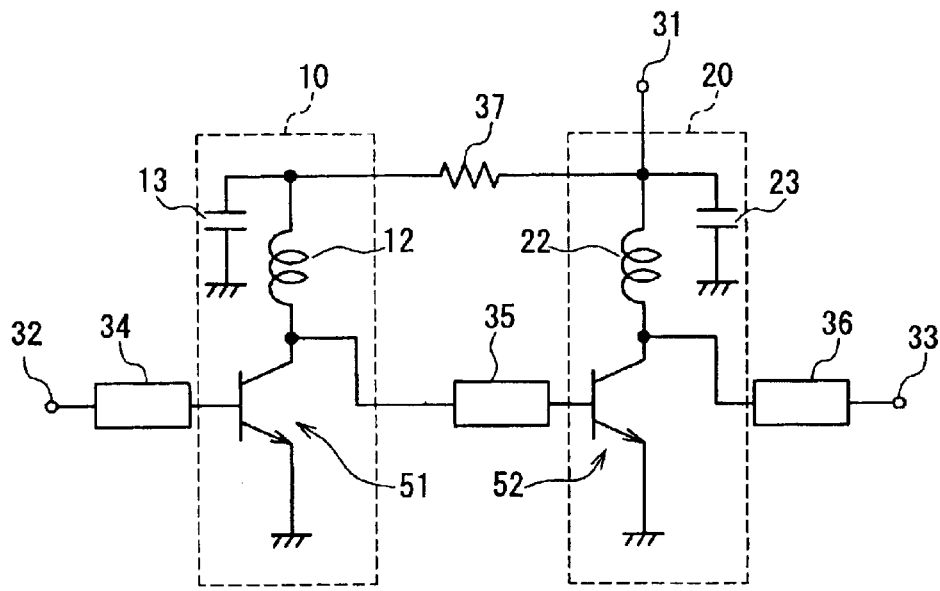
FIG. 5 is a circuit diagram showing the high-frequency circuit according to Embodiment 1 in which a bipolar transistor is used as an amplifying element.

FIG. 5 is a circuit diagram showing the high-frequency circuit according to Embodiment 1 in which a bipolar transistor is used as an amplifying element. The high-frequency circuit shown in FIG. 5 has the same configuration as that of the high-frequency circuit shown in FIG. 1 except that bipolar transistors 51 and 52 are used as the amplifying elements in the respective amplifying blocks. Therefore, the high-frequency circuit shown in FIG. 5 can perform the same function and produces the same effect as those described above with regard to the high-frequency circuit shown in FIG. 1.

(Embodiment 2)

Figure 6:
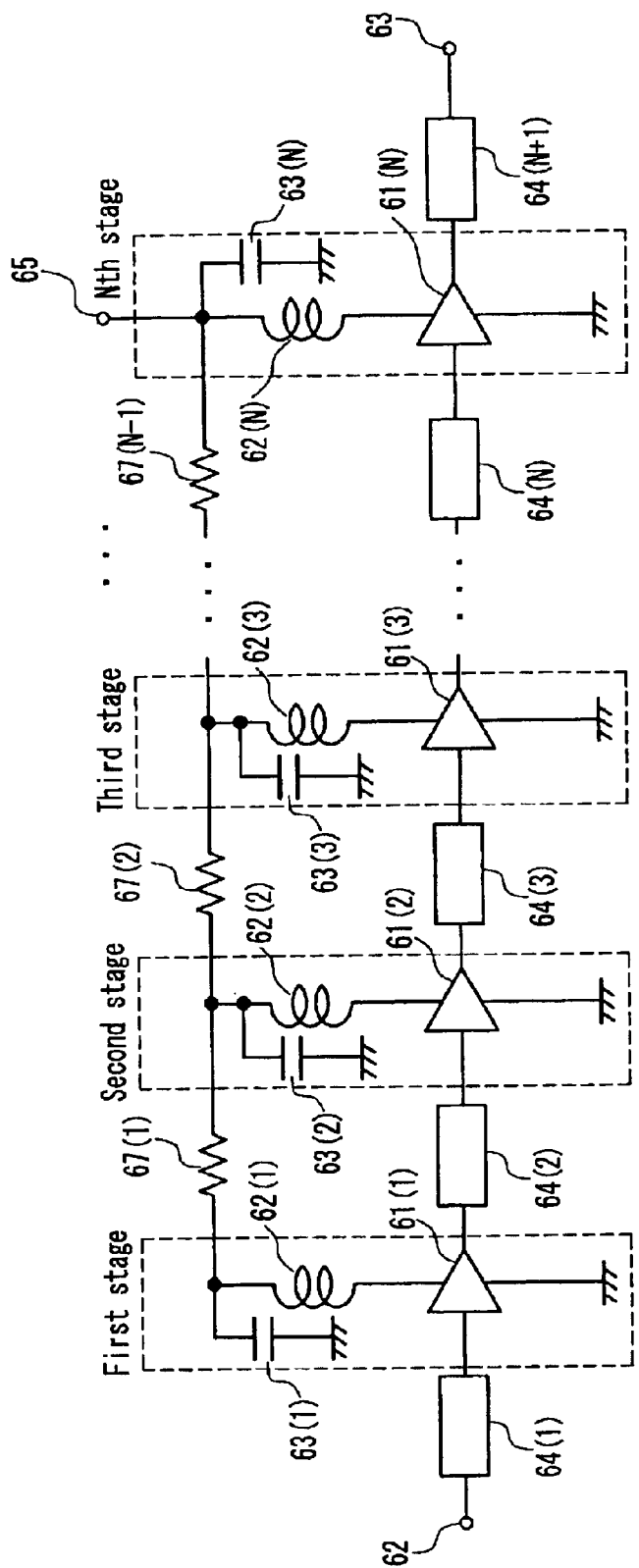
FIG. 6 is a circuit diagram showing a high-frequency circuit according to Embodiment 2 of the present invention.

Hereinafter, a high-frequency circuit according to Embodiment 2 of the present invention will be described with reference to FIG. 6. FIG. 6 is a circuit diagram showing a high-frequency circuit according to Embodiment 2 of the present invention.

As shown in FIG. 6, the high-frequency circuit of Embodiment 2 includes amplifying blocks arranged in N stages (N is an integer of 2 or more). Similarly to the high-frequency circuit of Embodiment 1, in the high-frequency circuit of Embodiment 2, each of the amplifying blocks includes an amplifying element 61, a choke inductor 62, and a by-pass capacitor 63. In FIG. 6, the number in a parenthesis indicates at which stage the respective elements are provided. For example, the amplifying element 61(1), the choke inductors 62(1), and the by-pass capacitor 63(1) are provided in the first-stage amplifying block. In the respective amplifying blocks, the amplifying elements 61(1) to 61(N), the choke inductors 62(1) to 62(N), and the by-pass capacitors 63(1) to 63(N) are connected with each other in the same manner as in Embodiment 1.

Also in Embodiment 2, resistive elements 67(1) to 67(N-1) are provided between the adjacent amplifying blocks on a power supply line, respectively. Further, on a signal line extending from an input terminal 62 to an output terminal 63, matching circuits 64(1) to 64(N+1) are provided.

Thus, also in the high-frequency circuit according to Embodiment 2, electric power is supplied to the amplifying blocks other than the final-stage amplifying block (the Nth-stage amplifying block) via the resistive elements 67(1) to 67(N-1) provided between a common power terminal 65 and the choke inductors 62(1) to 62(N), respectively.

Therefore, similarly to the high-frequency circuit according to Embodiment 1, the high-frequency circuit according to Embodiment 2 also can reduce the feedback of high-frequency signals caused between the amplifying blocks, thereby reducing the generation of an undesired peak. In addition, the high-frequency circuit of Embodiment 2 can contribute to the reduction in size of a chip. Moreover, in the high-frequency circuit of Embodiment 2, electric energy handled in the Nth-stage (final-stage) amplifying block can be made greater than that in any other amplifying blocks.

Furthermore, in the high-frequency circuit according to Embodiment 2, among power supply voltages (Vdd) supplied to the respective amplifying elements 61(1) to 61(N-1), the power supply voltage (Vdd) applied to the amplifying element 61(1) in the first-stage amplifying block is the smallest. Therefore, the voltage V applied to the common power terminal 65 and the resistance R of the resistive elements 67(1) to 67(N-1) preferably are set so that the power supply voltage (Vdd) applied to the amplifying element 61(1) in the first-stage amplifying block is greater than the knee voltage of the amplifying element 61(1).

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high-frequency circuit comprising:
   a plurality of amplifying blocks arranged in multi-stages, including at least a first-stage amplifying block and a final-stage amplifying block,
   each of the plurality of amplifying blocks including at least an amplifying element, a choke inductor, and a by-pass capacitor, in which a power terminal of the amplifying element is connected to one end of the choke inductor, the other end of the choke inductor is connected to one end of the by-pass capacitor, and the other end of the by-pass capacitor is grounded,
   electric power being supplied from a common power terminal to the amplifying elements in the respective amplifying blocks via the choke inductors in the respective amplifying blocks,
   wherein a resistive element is provided between the common power terminal and the choke inductor in the amplifying block other than the final-stage amplifying block so that the electric power is supplied to the amplifying element in the amplifying block other than the final-stage amplifying block via the resistive element and the choke inductor, and
   wherein at least the amplifying elements, the choke inductors, the by-pass capacitors, and the resistive element are provided on a same substrate.

2. The high-frequency circuit according to claim 1, wherein the amplifying element is a field-effect transistor.

3. The high-frequency circuit according to claim 1, wherein the amplifying element is a bipolar transistor.

4. The high-frequency circuit according to claim 1, wherein a voltage applied to the common power terminal and a resistance of the resistive element are set so that a voltage applied to the amplifying element in the first-stage amplifying block is greater than a knee voltage of the amplifying element in the first-stage amplifying block.

* * * * *